(12) United States Patent
Kondo et al.

(10) Patent No.: US 11,886,114 B2
(45) Date of Patent: Jan. 30, 2024

(54) PHOTOSENSITIVE INSULATING PASTE AND ELECTRONIC COMPONENT

(71) Applicant: Murata Manufacturing Co., Ltd., Kyoto-fu (JP)

(72) Inventors: Kenta Kondo, Nagaokakyo (JP); Shimpei Tanabe, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 722 days.

(21) Appl. No.: 16/995,420

(22) Filed: Aug. 17, 2020

(65) Prior Publication Data

US 2021/0096464 A1    Apr. 1, 2021

(30) Foreign Application Priority Data

Sep. 30, 2019  (JP) ................................. 2019-179450

(51) Int. Cl.
| | | |
|---|---|---|
| C03C 8/20 | (2006.01) | |
| G03F 7/004 | (2006.01) | |
| H05K 3/00 | (2006.01) | |
| H05K 1/03 | (2006.01) | |
| H05K 3/46 | (2006.01) | |
| G03F 7/028 | (2006.01) | |

(52) U.S. Cl.
CPC ............ G03F 7/0047 (2013.01); C03C 8/20 (2013.01); G03F 7/028 (2013.01); H05K 1/0306 (2013.01); H05K 3/0023 (2013.01); H05K 3/4667 (2013.01)

(58) Field of Classification Search
CPC .......... C03C 8/20; H05K 1/03; H05K 1/0306; H05K 3/0023; H05K 3/4667; G03F 7/0047; G03F 7/028

USPC .................................................... 174/137 B
See application file for complete search history.

(56) References Cited

U.S. PATENT DOCUMENTS

| | | | |
|---|---|---|---|
| 2004/0249040 A1 | 12/2004 | Yamashiki et al. | |
| 2019/0112222 A1* | 4/2019 | Kanbara | ................. G03F 7/029 |
| 2019/0208622 A1* | 7/2019 | Matsushita | ............ H05K 1/115 |

FOREIGN PATENT DOCUMENTS

| | | |
|---|---|---|
| JP | H6-202323 A | 7/1994 |
| JP | 2000-075502 A | 3/2000 |
| JP | 2002-162735 A | 6/2002 |
| JP | 2008-037719 A | 2/2008 |
| JP | 2012-246176 A | 12/2012 |
| WO | 03/038524 A1 | 5/2003 |

OTHER PUBLICATIONS

An Office Action; "Notice of Reasons for Refusal," mailed by the Japanese Patent Office dated Mar. 15, 2022, which corresponds to Japanese Patent Application No. 2019-179450 and is related to U.S. Appl. No. 16/995,420 with English language translation.

* cited by examiner

*Primary Examiner* — Tremesha S Willis
(74) *Attorney, Agent, or Firm* — Studebaker & Brackett PC

(57) ABSTRACT

A photosensitive insulating paste according to preferred embodiments of the present disclosure contains glass frit, a first inorganic filler, a second inorganic filler, an alkali-soluble polymer, a photosensitive monomer, a photopolymerization initiator, and a solvent. The first inorganic filler has a refractive index of 1.7 or higher. The second inorganic filler has a refractive index of 1.55 or lower. An electronic component according to preferred embodiments of the present disclosure is produced by using the photosensitive insulating paste.

10 Claims, 3 Drawing Sheets

PHOTOSENSITIVE INSULATING PASTE AND ELECTRONIC COMPONENT

CROSS-REFERENCE TO RELATED APPLICATION

This application claims benefit of priority to Japanese Patent Application No. 2019-179450, filed Sep. 30, 2019, the entire content of which is incorporated herein by reference.

BACKGROUND

Technical Field

The present disclosure relates to a photosensitive insulating paste and an electronic component

Background Art

Japanese Unexamined Patent Application Publication No. 2012-246176 discloses a typical photosensitive paste used in electronic components. To improve the denseness and the chemical resistance after firing, the photosensitive paste contains glass powder having a specific composition.

When the photosensitive paste is used for the insulating layer of an electronic component, the high light transmittance of the insulating layer is maintained after firing. Thus, when a portion between the internal electrode layer and the surface of the electronic component is thin, the internal electrode layer can be seen through the surface of the electronic component. In such a case, during the visual inspection of the electronic component, it is difficult to distinguish a foreign object attached to the outer surface of the electronic component from the internal electrode, thereby decreasing the productivity of the electronic component. Furthermore, the photosensitive paste does not contain an inorganic filler and thus cannot suppress the extension of a crack in the electronic component, thereby readily causing a crack.

A method that includes adding a light-shielding inorganic filler to the photosensitive paste to suppress the light transmittance after firing may be used. However, in such a method, the light transmittance is degraded during photolithographic patterning of the photosensitive paste, and thus, high resolution cannot be achieved. Other than such a method, to prevent the internal electrode layer from being visible through the electronic component surface, the thickness of the side gap portion of the electronic component may be increased. However, when the thickness of the side gap portion is increased, the design flexibility of electronic components is degraded, and miniaturization and high performance of electronic components cannot be achieved.

SUMMARY

Accordingly, the present disclosure provides a photosensitive insulating paste that provides high resolution before firing and that suppresses light transmittance and crack formation after firing and to provide an electronic component using such a photosensitive insulating paste.

A photosensitive insulating paste according to preferred embodiments of the present disclosure contains glass frit, a first inorganic filler, a second inorganic filler, an alkali-soluble polymer, a photosensitive monomer, a photopolymerization initiator, and a solvent. The first inorganic filler has a refractive index of 1.7 or higher. The second inorganic filler has a refractive index of 1.55 or lower.

An electronic component according to preferred embodiments of the present disclosure includes a multilayer body that includes a plurality of internal electrode layers and an insulating layer between the internal electrode layers in a stacking direction. Side gap portions are positioned between respective side surfaces of the multilayer body that are parallel to the stacking direction and the plurality of internal electrode layers. The side gap portions contain glass, a first inorganic filler, and a second inorganic filler. The side gap portions have an average thickness of 5 µm or more and 30 µm or less (i.e., from 5 µm to 30 µm). The first inorganic filler has a refractive index of 1.7 or higher. The second inorganic filler has a refractive index of 1.55 or lower.

According to preferred embodiments of the present disclosure, a photosensitive insulating paste that provides high resolution before firing and that suppresses light transmittance and crack formation after firing and an electronic component using such an photosensitive insulating paste are provided.

Other features, elements, characteristics and advantages of the present disclosure will become more apparent from the following detailed description of preferred embodiments of the present disclosure with reference to the attached drawings.

DETAILED DESCRIPTION

1. Photosensitive Insulating Paste

Figure 1:
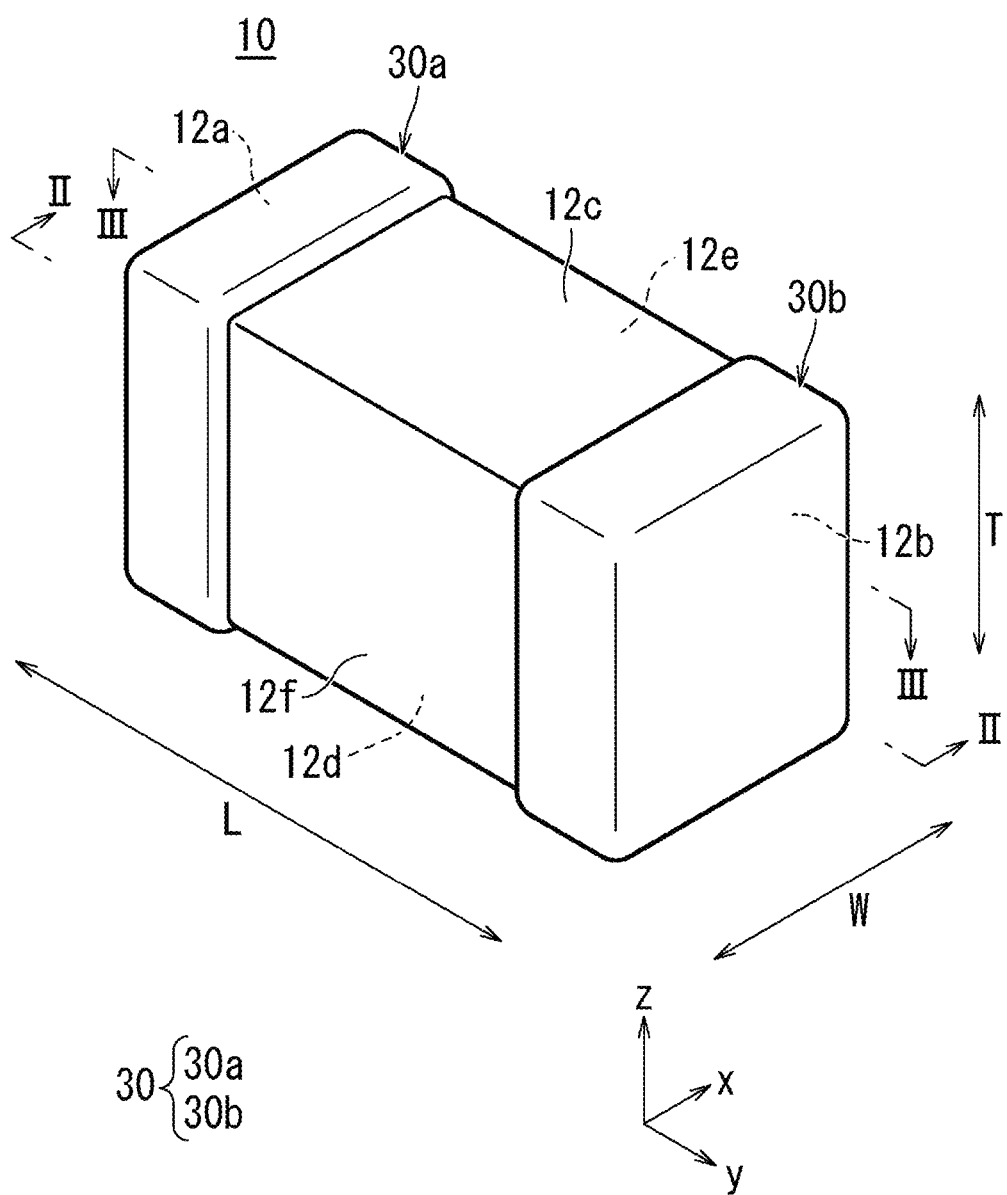
FIG. 1 is an external perspective view of a coil electronic component according to an embodiment of the present disclosure.

A photosensitive insulating paste according to an embodiment of the present disclosure contains glass frit, a first inorganic filler (inorganic filler for coloring), a second inorganic filler (transparent inorganic filler), an alkali-soluble polymer, a photosensitive monomer, a photopolymerization initiator, and a solvent. An organic dye is optionally contained.

Borosilicate glass (softening point 760° C.) may be used for the glass frit. Examples of the glass frit include glass containing $SiO_2$, $B_2O_3$, $K_2O$, $Li_2O$, CaO, ZnO, $Bi_2O_3$, and/or $Al_2O_3$, such as $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, and $Bi_2O_3$—$B_2O_3$—$SiO_2$—$Al_2O_3$-based glass, in addition to borosilicate glass. Such inorganic ingredients may be used in a combination of two or more. The glass frit preferably has a softening point of 700° C. or higher and lower than 900° C. (i.e., from 700° C. to 900° C.).

The glass frit preferably has a refractive index of 1.55 or lower and more preferably substantially the same refractive index as the second inorganic filler.

The first inorganic filler (inorganic filler for coloring) has a refractive index of 1.7 or higher. The first inorganic filler preferably has a softening point of 950° C. or higher. Alumina is suitably used for the first inorganic filler. Examples of the first inorganic filler include titania, zirconia, and ceria, in addition to alumina.

The second inorganic filler (transparent inorganic filler) has a refractive index of 1.55 or lower. The second inorganic filler preferably has a softening point of 950° C. or higher. Quartz is suitably used for the second inorganic filler. Quartz may have any degree of crystallinity. Crystallized glass may be used for the transparent inorganic filler.

The refractive index of the first inorganic filler and the second inorganic filler is measured at a wavelength of 589.3 nm (D-line of sodium).

The first inorganic filler and the second inorganic filler each preferably have an average particle size of 0.1 μm or more and 5.0 μm or less (i.e., from 0.1 μm to 5.0 μm) and more preferably 0.3 μm or more and 3.0 μm or less (i.e., from 0.3 μm to 3.0 μm). If each organic filler has an average particle size of less than 0.1 μm, the dispersion of the paste becomes difficult. On the other hand, if a photosensitive insulating paste that contains inorganic fillers each having an average particle size of more than 5.0 μm is used for the insulating layer of an electronic component, the insulating layer has a rougher surface and a malformed groove, which is not preferable.

The alkali-soluble polymer contains an acrylic-based polymer having a carboxy group in a side chain. The resin containing an acrylic-based copolymer having a carboxy group in a side chain may be produced by copolymerizing an unsaturated carboxylic acid and an ethylenic unsaturated compound.

Examples of the unsaturated carboxylic acid include acrylic acid, methacrylic acid, maleic acid, fumaric acid, and vinyl acetate, and anhydrides thereof. Examples of the ethylenic unsaturated compound include acrylic acid esters, such as methyl acrylate and ethyl acrylate, methacrylic acid esters, such as methyl methacrylate and ethyl methacrylate, and fumaric acid esters, such as monoethyl fumarate.

The acrylic-based copolymer having a carboxy group in a side chain may be produced by introducing an unsaturated bond having the following structure.

(1) An acrylic-based monomer having a functional group that can react with a carboxy group, such as an epoxy group, is added to the carboxy group in a side chain of an acrylic-based copolymer.

(2) An unsaturated monocarboxylic acid is reacted with an acrylic-based copolymer that is the same as the above acrylic-based copolymer except that an epoxy group is introduced in place of the carboxy group in the side chain. Thereafter, a saturated or unsaturated polycarboxylic anhydride is further introduced to the copolymer.

The acrylic-based copolymer having a carboxy group in a side chain preferably has a weight average molecular weight (Mw) of 50,000 or lower and an acid value of 30 or higher and 150 or lower (i.e., from 30 to 150).

The photosensitive monomer may be dipentaerythritol monohydroxypentaacrylate. Examples of the photosensitive monomer include hexanediol triacrylate, tripropyleneglycol triacrylate, trimethylol propane triacrylate, EO-modified trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, pentaerythritol triacrylate, propoxylated trymethylolpropane triacrylate, propoxylated glyceril triacrylate, pentaerythritol tetraacrylate, ditrimethylolpropane tetraacrylate, and ethoxylated pentaerythritol tetraacrylate, in addition to dipentaerythritol monohydroxy pentaacrylate. Compounds in which one or some acrylates or all acrylates in the molecule are changed to methacrylates may be used.

When the amount of the glass frit is denoted as A, the amount of the first inorganic filler is denoted as B, and the amount of the second inorganic filler is denoted as C, the following conditions are preferably satisfied in the photosensitive insulating paste: A+B+C=100; B, 5 vol % or higher and 20 vol % or lower (i.e., from 5 vol % to 20 vol %); and C, (25-B) vol % or higher and (40-B) vol % or lower (i.e., from (25-B) vol % to (40-B) vol %).

The photopolymerization initiator may be an acetophenone-based compound.

The solvent may be 1-(2-methoxy-2-methylethoxy)-2-propanol.

An organic dye optionally contained may be an azo-based compound. Such an organic dye is a UV absorber used to adjust UV transmittance when the photosensitive insulating paste is used for photolithographic patterning.

2. Method for Producing Photosensitive Insulating Paste

Next, a method for producing the photosensitive insulating paste will be described.

The photosensitive insulating paste is produced by sufficiently mixing glass frit, a first inorganic filler (inorganic filler for coloring), a second inorganic filler (transparent inorganic filler), an alkali-soluble polymer, a photopolymerization initiator, a solvent, and an organic dye together with three rolls.

The glass frit may be borosilicate glass (softening point 760° C.). Examples of the glass frit include glass containing $SiO_2$, $B_2O_3$, $K_2O$, $Li_2O$, CaO, ZnO, $Bi_2O_3$, and/or $Al_2O_3$, such as $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, and $Bi_2O_3$—$B_2O_3$—$SiO_2$—$Al_2O_3$-based glass, in addition to borosilicate glass. Such inorganic ingredients may be used in a combination of two or more. The glass frit preferably has a softening point of 700° C. or higher and lower than 900° C. (i.e., from 700° C. to 900° C.).

The first inorganic filler (inorganic filler for coloring) has a refractive index of 1.7 or higher. The first inorganic filler preferably has a softening point of 950° C. or higher. Alumina is suitably used for the first inorganic filler. Examples of the first inorganic filler include titania, zirconia, and ceria, in addition to alumina.

The second inorganic filler (transparent inorganic filler) has a refractive index of 1.55 or lower. The second inorganic filler preferably has a softening point of 950° C. or higher. Quartz is suitably used for the second inorganic filler. Quartz may have any degree of crystallinity. Crystallized glass may be used for the transparent inorganic filler.

The first inorganic filler and the second inorganic filler each preferably have an average particle size of 0.1 μm or more and 5.0 μm or less (i.e., from 0.1 μm to 5.0 μm) and more preferably 0.3 μm or more and 3.0 μm or less (i.e., from 0.3 μm to 3.0 μm).

The alkali-soluble polymer contains an acrylic-based polymer having a carboxy group in a side chain. The resin containing an acrylic-based copolymer having a carboxy group in a side chain may be produced by copolymerizing an unsaturated carboxylic acid and an ethylenic unsaturated compound.

Examples of the unsaturated carboxylic acid include acrylic acid, methacrylic acid, maleic acid, fumaric acid, and vinyl acetate, and anhydrides thereof. Examples of the ethylenic unsaturated compound include acrylic acid esters, such as methyl acrylate and ethyl acrylate, methacrylic acid esters, such as methyl methacrylate and ethyl methacrylate, and fumaric acid esters, such as monoethyl fumarate.

The acrylic-based copolymer having a carboxy group in a side chain may be produced by introducing an unsaturated bond having the following structure.

(1) An acrylic-based monomer having a functional group that can react with a carboxy group, such as an epoxy group, is added to the carboxy group in a side chain of an acrylic-based copolymer.

(2) An unsaturated monocarboxylic acid is reacted with an acrylic-based copolymer that is the same as the above acrylic-based copolymer except that an epoxy group is introduced in place of the carboxy group in the side chain. Thereafter, a saturated or unsaturated polycarboxylic anhydride is further introduced to the copolymer.

The acrylic-based copolymer having a carboxy group in a side chain is preferably has a weight average molecular weight (Mw) of 50,000 or less and an acid value of 30 or higher and 150 or lower (i.e., from 30 to 150).

The photosensitive monomer may be dipentaerythritol monohydroxy pentaacrylate. Examples of the photosensitive monomer include hexanediol triacrylate, tripropyleneglycol triacrylate, trimethylol propane triacrylate, EO-modified trimethylol propane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, pentaerythritol triacrylate, propoxylated trymethylolpropane triacrylate, propoxylated glyceril triacrylate, pentaerythritol tetraacrylate, ditrimethylolpropane tetraacrylate, and ethoxylated pentaerythritol tetraacrylate, in addition to dipentaerythritol monohydroxy pentaacrylate. Compounds in which one or some acrylates or all acrylates in the molecule are changed to methacrylates may be used.

When the amount of the glass frit is denoted as A, the amount of the first inorganic filler is denoted as B, and the amount of the second inorganic filler is denoted as C, the following conditions are preferably satisfied in the photosensitive insulating paste: A+B+C=100; B, 5 vol % or higher and 20 vol % or lower (i.e., from 5 vol % to 20 vol %); and C, (25-B) vol % or higher and (40-B) vol % or lower (i.e., from (25-B) vol % to (40-B) vol %).

The photopolymerization initiator may be an acetophenone-based compound.

The solvent may be 1-(2-methoxy-2-methylethoxy)-2-propanol.

An organic dye optionally contained may be an azo-based compound. Such an organic dye is a UV absorber used to adjust UV transmittance when the photosensitive insulating paste is used for photolithographic patterning.

The photosensitive insulating paste according to the preferred embodiments of the present disclosure contains glass frit, a first inorganic filler (inorganic filler for coloring), a second inorganic filler (transparent inorganic filler), an alkali-soluble polymer, a photosensitive monomer, a photopolymerization initiator, and a solvent. The first inorganic filler has a refractive index of 1.7 or higher. The second inorganic filler has a refractive index of 1.55 or lower. Thus, when the photosensitive insulating paste is used for the insulating layer of an electronic component, the light transmittance of the insulating layer can be adjusted by changing the amount of each inorganic filler.

In a case in which the following conditions are satisfied in the photosensitive insulating paste according to the preferred embodiments of the present disclosure: A+B+C=100; B, 5 vol % or higher and 20 vol % or lower (i.e., from 5 vol % to 20 vol %); and C, (25-B) vol % or higher and (40-B) vol % or lower (i.e., from (25-B) vol % to (40-B) vol %), where the amount of the glass frit is denoted as A, the amount of the first inorganic filler is denoted as B, and the amount of the second inorganic filler is denoted as C, when used for the insulating layer of an electronic component, the photosensitive insulating paste has high light transmittance before firing and suppresses light transmittance after firing. In addition, sintering of the insulating layer progresses sufficiently. Therefore, the mechanical strength as a ceramic material is exhibited.

Furthermore, in a case in which the glass frit has a softening point of 700° C. or higher and lower than 900° C. (i.e., from 700° C. to 900° C.) and the first inorganic filler and the second inorganic filler each have a melting point of 950° C. or higher in the photosensitive insulating paste according to the preferred embodiments of the present disclosure, when the photosensitive insulating paste is used for the insulating layer of an electronic component, the melting point of the glass frit is in the sintering temperature range or lower, and thus, melting that is essential for sintering of glass ceramics occurs. However, each inorganic filler does not melt in the sintering temperature range and thus exhibits the function thereof. This enables the appropriate firing temperature at which the porosity of the insulating layer is reliably 5% or lower to be 850° C. or higher and 950° C. or lower (i.e., from 850° C. to 950° C.) and decreases the resistance of the coil conductive layer (internal electrode layer) fired simultaneously with the insulating layer.

3. Coil Electronic Component

Next, a coil electronic component will be described as an exemplary electronic component produced by using the photosensitive insulating paste.

Figure 2:
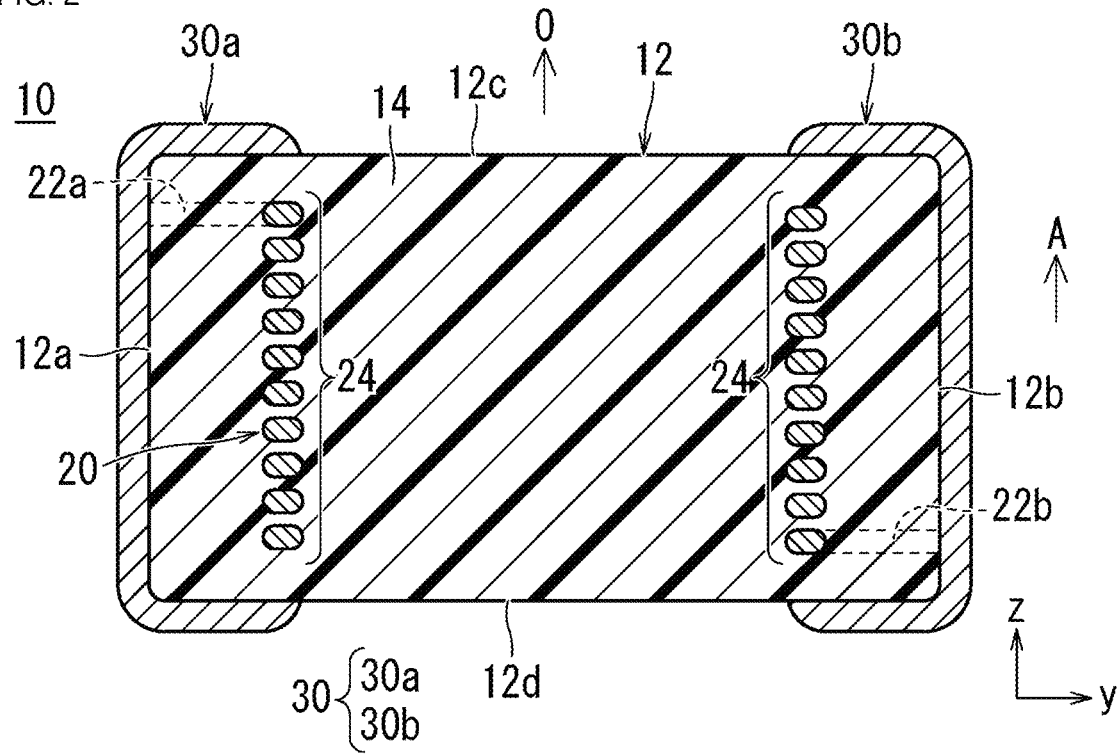
FIG. 2 is a cross-sectional view of the coil electronic component taken along line II-II of FIG. 1.
Figure 3:
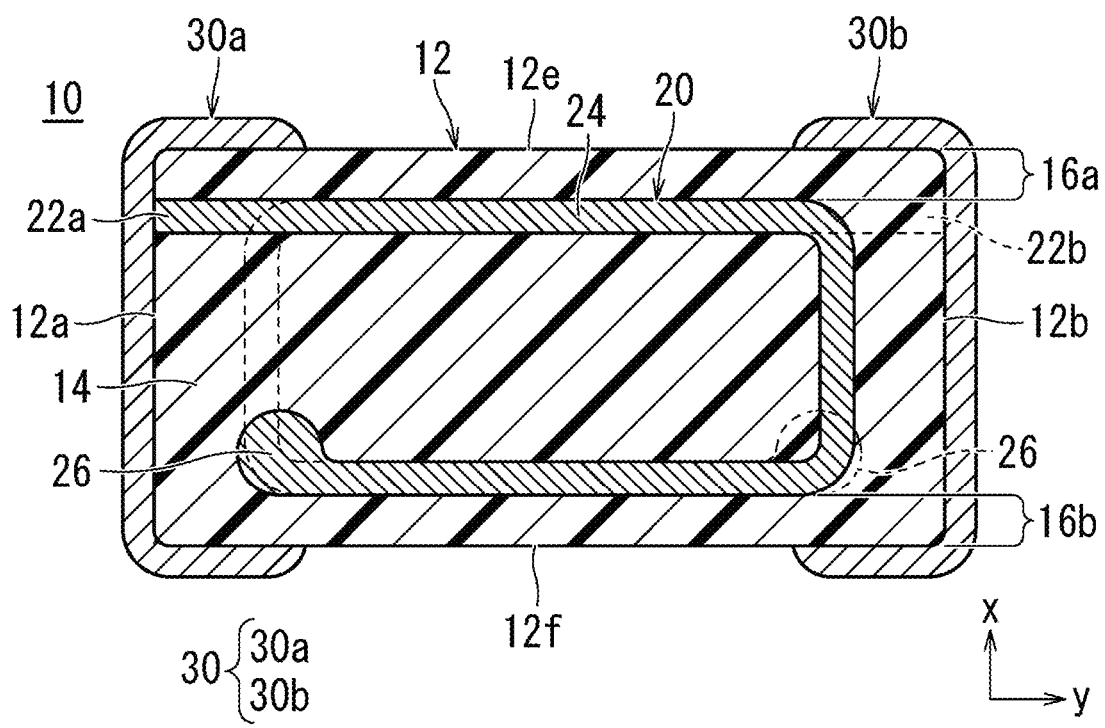
FIG. 3 is a cross-sectional view of the coil electronic component taken along line III-III of FIG. 1.

FIG. 1 is an external perspective view of an embodiment of the electronic component. FIG. 2 is a cross-sectional view of the coil electronic component taken along line II-II of FIG. 1. FIG. 3 is a cross-sectional view of the coil electronic component taken along line III-III of FIG. 1.

As illustrated in FIG. 1 and FIG. 3, a coil electronic component 10 includes a multilayer body 12, a spiral coil 20 disposed in the multilayer body 12, and external electrodes 30, which are disposed on the multilayer body 12 and electrically connected to the coil 20.

The coil electronic component 10 is electrically connected to the wiring of a circuit board not shown via the external electrodes 30. The coil electronic component 10 may be used as an impedance matching coil (matching coil) in a high-frequency circuit in electronic devices, such as personal computers, DVD players, digital cameras, TVs, cell phones, automotive electronics, medical machines, and industrial machines. The coil electronic component 10 is not only used as such a circuit and can be used as a circuit, such as a tuning circuit, a filter circuit, or an rectifying and smoothing circuit.

The multilayer body 12 includes insulating layers 14 stacked on each other. The multilayer body 12 is formed to have a substantially cuboid shape. The multilayer body 12 has a first end surface 12a, a second end surface 12b facing the first end surface 12a, a first main surface 12c, which is disposed between the first end surface 12a and the second end surface 12b and connected to the first end surface 12a and the second end surface 12b, a second main surface 12d facing the first main surface 12c, a first side surface 12e, which is disposed between the first end surface 12a and the second end surface 12b, connected to the first end surface 12a and the second end surface 12b, and perpendicularly crosses the first main surface 12c, and a second side surface 12f opposing the first side surface 12e. The first end surface 12a, the second end surface 12b, the first side surface 12e, and the second side surface 12f are parallel to the stacking direction A of the insulating layer 14. In consideration of the range of realistic variability, the term "parallel" in the present application does not only include an exactly parallel relationship and also includes a substantially parallel relationship. In the multilayer body 12, an interface between the insulating layers 14 may be unclear due to, for example, firing.

The shape and dimensions of the multilayer body 12 are not particularly limited and may be appropriately set in accordance with the application. Typically, the shape is substantially cuboid, and the dimension in the X-axis direction is 0.1 mm or more and 1.0 mm or less (i.e., from 0.1 mm to 1.0 mm), the dimension in the Y-axis direction is 0.2 mm or more and 1.6 mm or less (i.e., from 0.2 mm to 1.6 mm), and the dimension in the Z-axis direction is 0.1 mm or more and 1.0 mm or less (i.e., from 0.1 mm to 1.0 mm).

The insulating layer 14 contains glass, a first inorganic filler, and a second inorganic filler.

The glass may be borosilicate glass (softening point 760° C.). Examples of the glass include glass containing $SiO_2$, $B_2O_3$, $K_2O$, $Li_2O$, CaO, ZnO, $Bi_2O_3$, and/or $Al_2O_3$, such as $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, and $Bi_2O_3$—$B_2O_3$—$SiO_2$—$Al_2O_3$-based glass, in addition to borosilicate glass. Such inorganic ingredients may be used in a combination of two or more. The glass preferably has a softening point of 700° C. or higher and lower than 900° C. (i.e., from 700° C. to 900° C.) since the multilayer body 12 is fired at 850° C. or higher and 950° C. or lower (i.e., from 850° C. to 950° C.).

The glass preferably has a refractive index of 1.55 or lower and more preferably substantially the same refractive index as the second inorganic filler.

The first inorganic filler (inorganic filler for coloring) has a refractive index of 1.7 or higher. The first inorganic filler preferably has a softening point of 950° C. or higher. Alumina is suitably used for the first inorganic filler. Examples of the first inorganic filler include titania, zirconia, and ceria, in addition to alumina.

The second inorganic filler (transparent inorganic filler) has a refractive index of 1.55 or lower. The second inorganic filler preferably has a softening point of 950° C. or higher. Quartz is suitably used for the second inorganic filler. Quartz may have any degree of crystallinity. The transparent inorganic filler may be crystallized glass.

When the glass is denoted as A, the first inorganic filler is denoted as B, and the second inorganic filler is denoted as C in the insulating layers 14, an area ratio between A and B and C satisfies the following conditions: A+B+C=100; B, 5% or higher and 20% or lower (i.e., from 5% to 20%); and C, (25-B) % or higher and (40-B) % or lower (i.e., from (25-B) % to (40-B) %).

Such area percentages are determined as follows. The coil electronic component 10 is polished to ½L (the center portion in the Y-axis direction) to expose a WT cross section. The glass, the first inorganic filler, and the second inorganic filler in the WT cross section are determined by EDX or SEM. Then, the area percentage is calculated based on the information of the measurement region.

In the present embodiment, the area percentage is substantially the same as the volume percentage.

The multilayer body 12 preferably has a porosity of 5% or lower.

The porosity is determined as follows. The coil electronic component 10 is polished to the center in the Y-axis direction to expose a cross section. The image of the cross section observed by SEM is subjected to a binarization process based on tones to find a sintered portion of the multilayer body and remaining pores. Then, the area percentage of the pores relative to the multilayer body is calculated and defined as the porosity.

The external electrodes 30 include a first external electrode 30a and a second external electrode 30b.

The first external electrode 30a is disposed on the first end surface 12a of the multilayer body 12. The first external electrode 30a is formed so as to extend from the first end surface 12a of the multilayer body 12 and partially cover each of the first main surface 12c, the second main surface 12d, the first side surface 12e, and the second side surface 12f. The first external electrode 30a is connected to an extending electrode 22a, which is positioned near the first main surface 12c in the Z-axis direction.

The second external electrode 30b is disposed on the second end surface 12b of the multilayer body 12. The second external electrode 30b is formed so as to extend from the second end surface 12b of the multilayer body 12 and partially cover each of the first main surface 12c, the second main surface 12d, the first side surface 12e, and the second side surface 12f. The second external electrode 30b is connected to an extending electrode 22b, which is positioned near the second main surface 12d in the Z-axis direction.

Therefore, the external electrodes 30 are connected to the respective ends of the coil 20 forming a coil pattern.

In the present embodiment, the stacking direction of the insulating layers 14 and the coil 20 coincides with the Z-axis direction, and the surfaces of the external electrodes 30 are parallel to the X-axis and the Y-axis. The X-axis, the Y-axis, and the Z-axis are perpendicular to each other. The winding axis direction of the coil 20 in the coil electronic component 10 in FIG. 1 is substantially the same as the Z-axis direction.

The first external electrode 30a and the second external electrode 30b may contain a conductive material, such as Ag or Cu, and glass particles.

The coil 20 contains the same conductive material and glass particles as the first and second external electrodes 30a and 30b. The coil 20 is spirally wound in the stacking direction A of the insulating layers 14. In the coil 20, the extending electrode 22a, which is positioned near the first main surface 12c, is connected to the first external electrode 30a, and the extending electrode 22b, which is positioned near the second main surface 12d is connected to the second external electrode 30b.

The coil 20 has a substantially oval shape when viewed in the axial direction O and may have another shape. The coil 20 may have a circular, oval, or rectangular shape, or another polygonal shape. The axial direction O of the coil 20 refers to a direction parallel to the central axis of the spiral formed by winding the coil 20. The axial direction O of the coil 20 and the stacking direction A of the insulating layers 14 are the same with each other.

The coil 20 includes coil conductive layers 24. The coil conductive layers 24 are internal electrode layers wound on the respective insulating layers 14. The coil conductive layers 24 adjacent to each other in the stacking direction A are electrically connected to each other in series via a via conductive layer 26, which extends through the insulating layer 14 in the thickness direction. In such a way, the coil conductive layers 24 are electrically connected to each other in series and form a spiral shape. Specifically, in the structure of the coil 20, the coil conductive layers 24, each of which is wound less than one turn, are stacked on each other and electrically connected to each other in series. The coil 20 has a helical shape.

As illustrated in FIG. 3, the multilayer body 12 includes aside gap portion 16a between the first side surface 12e and a side of the coil conductive layer 24 that is the closest to the first side surface 12e in the X-axis direction. The multilayer body 12 includes a side gap portion 16b between the second side surface 12f and a side of the coil conductive layer 24 that is the closest to the second side surface 12f in the X-axis direction. The side gap portions 16a and 16b have an average thickness of 5 µm or more and 30 µm or less (i.e., from 5 µm to 30 µm) in the X-axis direction.

The shape and dimensions of the coil electronic component 10 are not particularly limited and may be appropriately determined in accordance with the application. Typically, the dimension in the X-axis direction (dimension W) is 0.1 mm or more and 1.0 mm or less (i.e., from 0.1 mm to 1.0 mm), the dimension in the Y-axis direction (dimension L) is 0.2 mm or more and 1.6 mm or less (i.e., from 0.2 mm to 1.6 mm), and the dimension in the Z-axis direction (dimension T) is 0.1 mm or more and 1.0 mm or less (i.e., from 0.1 mm to 1.0 mm), for example.

4. Method for Producing Coil Electronic Component

Next, a method for producing the coil electronic component 10 will be described.

First, the photosensitive insulating paste and a photosensitive conductive paste are prepared. The photosensitive insulating paste contains glass frit, a first inorganic filler, and a second inorganic filler. The photosensitive insulating paste can be prepared by the above method.

Next, an insulating paste is applied to form an outer insulating layer. The photosensitive insulating paste is applied to the outer insulating layer to form a first insulating layer. The insulating paste may be applied by screen printing.

The insulating paste for forming the outer insulating layer may have the same composition as the photosensitive insulating paste or may have the composition described later.

(a) organic binder (material: acrylic-based polymer)
(b) solvent (material: 1-(2-methoxy-2-methylethoxy)-2-propanol)
(c) inorganic filler (material: alumina)
(d) glass frit (borosilicate glass)

The organic binder is not necessarily an alkali-soluble polymer since patterning is not performed to the outer insulating layer. The organic binder may be an alkali-soluble polymer. The inorganic filler is preferably a filler that can be co-fired with the inorganic filler for the photosensitive insulating paste.

Next, the photosensitive conductive paste is applied by screen printing to the outer insulating layer formed as described above. After the paste is dried, selective exposure and developing are performed to form a first conductive layer (coil pattern).

The photosensitive insulating paste is subsequently applied by screen printing to the first conductive layer (coil pattern) formed and a portion adjacent to the first conductive layer (to the entire surface) to form the first photosensitive insulating paste layer (insulating layer).

Then, the photosensitive insulating paste is selectively exposed and developed to form a via hole at a predetermined position.

Thereafter, the photosensitive conductive paste is applied to the entire surface by screen printing and dried. Selective exposure and developing are subsequently performed to form the second conductive layer (coil pattern).

The photosensitive insulating paste is further applied to the conductive layer and a portion adjacent to the conductive layer, and a via hole is formed to form the second insulating layer.

The above method is repeated to form the photosensitive insulating paste layers (insulating layers) having a via hole at a predetermined position and the coil patterns (conductive layers), until a predetermined number of such layers are obtained.

Then, the photosensitive insulating paste is further applied repeatedly by screen printing to form an external insulating layer. The external insulating layer is positioned outward of the coil conductive layer portion.

By means of such processes, a mother multilayer body is obtained.

Then, the mother multilayer body is cut into unfired multilayer bodies by, for example, dicing.

The unfired multilayer body is fired at 850° C. or higher and 950° C. or lower (i.e., from 850° C. to 950° C.) to obtain the multilayer body 12.

Thereafter, the multilayer body 12 is optionally subjected to barrel finishing or plating.

Then, the external electrodes 30 are formed. A conductive paste for the external electrode that contains a glass ingredient and metal is applied by, for example, dipping to an exposed portion of the extending electrode 22a that is exposed from the first end surface 12a of the multilayer body 12. Then the conductive paste is fired to form the first external electrode 30a. In the same manner, a conductive paste for the external electrode that contains a glass ingredient and metal is applied by, for example, dipping to an exposed portion of the extending electrode 22b that is exposed from the second end surface 12b of the multilayer body 12. Then the conductive paste is fired to form the second external electrode 30b.

The coil conductive layers 24 (internal electrode layers) and the external electrodes 30 may be simultaneously fired.

By means of such processes, the coil electronic component 10 is produced.

The side gap portions 16a and 16b of the coil electronic component 10 in FIG. 1 each have an average thickness of 5 µm or more and 30 µm or less (i.e., from 5 µm to 30 µm). Thus, the coil conductive layers 24 (internal electrode layers) can be arranged in a relatively wide area in the electronic component, and the mechanical strength can be maintained. Therefore, the quality factor, which is a characteristic of the coil electronic component 10, improves.

When the coil electronic component 10 in FIG. 1 has a porosity of 5% or lower, the mechanical strength of the coil electronic component 10 further improves.

Furthermore, when a photosensitive insulating paste that contains the first inorganic filler (alumina) having a higher refractive index in an amount of 5 vol % or higher and 20 vol % or lower (i.e., from 5 vol % to 20 vol %) and the first and second inorganic fillers in an total amount of 25 vol % or higher and 40 vol % or lower (i.e., from 25 vol % to 40 vol %) is used for the insulating layer of an electronic component, such as the coil electronic component 10 in FIG. 1, high-light transmittance is exhibited before firing and thus, high resolution is achieved. In addition, after firing, light transmittance is suppressed, and thus, the color of a portion of the coil electronic component surface that is above the internal electrode layers and the color of the side gap portion can be maintained to be the same with each other after firing. Sintering of the insulating layer progresses sufficiently, and thus, the mechanical strength as a ceramic material can be exhibited.

5. Examples

Next, to confirm the effect of the photosensitive insulating paste according to the preferred embodiments of the present disclosure, a coil electronic component was produced by using the photosensitive insulating paste, and evaluation of the appearance of the coil electronic component, evaluation of load that causes a crack, evaluation of the denseness within the coil electronic component, and an experiment for measuring the resolution (aspect ratio) were performed.

(1) Specifications of Sample

The specifications of a sample used in the present experiment are as follows.

dimensions of the coil electronic component (designed values): dimension L, 0.4 mm; dimension W, 0.2 mm; dimension T, 0.2 mm.

composition of the insulating layer: the composition ratios in Table 1 were used for glass (glass frit), the first inorganic filler, and the second inorganic filler. The glass (glass frit) was borosilicate glass, the first inorganic filler was alumina, and the second inorganic filler was quartz.

dimension of the side gap portion: 17.5 μm A cross section of the sample was exposed by destructive physical analysis (DPA), and the dimension of the side gap portion was measured by using a microscope. Five samples were used for each composition.

refractive index of inorganic fillers: the first inorganic filler, 1.8; the second inorganic filler, 1.5.

The photosensitive insulating paste was produced by sufficiently mixing the following materials together with three rolls.

(a) glass frit (borosilicate glass)
(b) the first inorganic filler (alumina) and the second inorganic filler (quartz)
(c) alkali-soluble polymer (acrylic-based polymer having a carboxy group in a side chain)
(d) photosensitive monomer (multi-functional acrylate: dipentaerythritol monohydroxy pentaacrylate)
(e) photopolymerization initiator (acetophenone-based compound)
(f) solvent (1-(2-methoxy-2-methylethoxy)-2-propanol)
(g) organic dye (azo-based compound)

The glass frit had an average particle size of 1.0 μm. The first inorganic filler had an average particle size of 0.5 μm. The second inorganic filler had an average particle size of 1.0 μm.

(2) Method for Measuring Refractive Index of Inorganic Filler

To measure the refractive index, a composition analysis method was used. A sample was polished to ½L to expose a WT cross section. Regarding the WT cross section, the composition analysis was performed by EDX, and the ratio of the glass portion, the first inorganic filler portion, and the second inorganic filler portion was determined. From the results, the composition ratio was determined, and the refractive index was presumed.

(3) Observation of Color of Coil Electronic Component Surface

The color of the surface of a coil electronic component that was a sample was observed under a microscope. Specifically, a portion of the coil electronic component surface that was above the coil conductive layers (internal electrode layers) and the side gap portion were observed by visual inspection to see whether the colors were the same with each other. In a case in which the internal electrode layers were visible through a portion of the coil electronic component surface that was above the internal electrode layers and thus, the color of such a portion and the color of the side gap portion were different from each other by visual inspection, the case was evaluated as poor (P), and a case other than such a case was evaluated as good (G).

(4) Evaluation of Crack Formation Load

Figure 4:
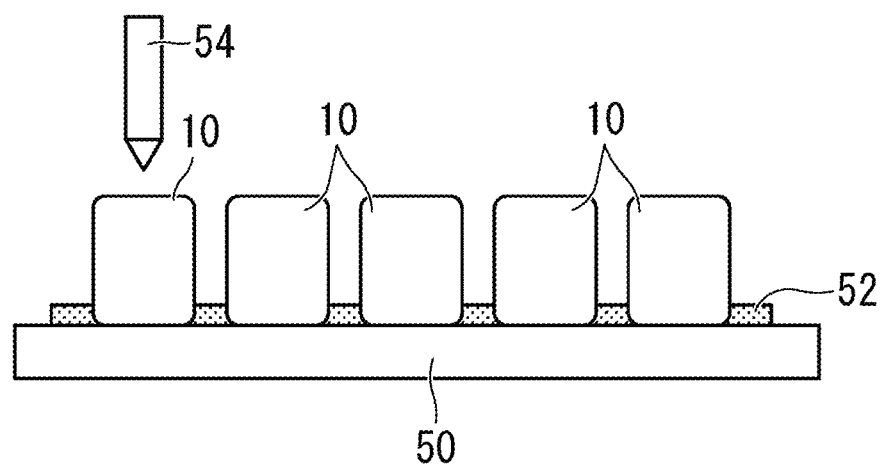
FIG. 4 illustrates the method for evaluating a crack formation load.

As illustrated in FIG. 4, the samples (coil electronic components 10) were each fixed to an alumina substrate 50 by using an adhesive 52 with a side surface facing down. The adhesive 52 was an instant adhesive. Then, the alumina substrate 50, to which the samples were bonded, was fixed to the evaluation stage of a nano indenter. Then, a portion of each sample was pressed with an indenter 54, and test load (p)-displacement (h) data were plotted. From the obtained test load (p)-displacement (h) data, contact stiffness (S=dp/dh) was calculated by using a slope obtained by increasing the load, and contact stiffness (S)-test load (p) data were plotted. Among troughs indicating a decrease in the contact stiffness in the plotted data, it was determined that the first crack was formed in the chip when the trough at the lowest load was observed, and such a load was defined as "crack formation load". In a case in which the crack formation load was 30 N or higher, the case was evaluated as good, and in a case in which the crack formation load was 74 N or higher, the case was evaluated as excellent.

The nano indenter apparatus and measurement conditions were as follows.

apparatus: nano-indentation tester ENT-1100a (manufactured by ELIONIX INC.)
test load: 100 gf
step interval: 20 msec (5) Method for Evaluating Resolution (Aspect Ratio)

The paste was applied at a thickness of 20 μm by screen printing. After drying in a safety oven, exposing treatment was performed through a photomask having opening portions having different dimensions, and developing with an alkaline aqueous solution was performed to form a wiring pattern. The thickness and width of a pattern produced without a residue or a defect of the pattern were measured, and the aspect ratio (thickness/width) was calculated.

(6) Evaluation of Denseness within Multilayer Body

Figure 5A:
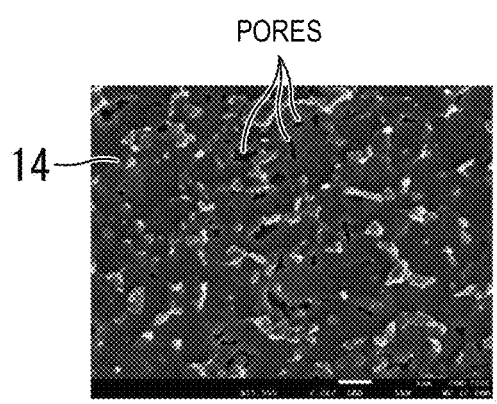
FIG. 5A illustrates the state of an insulating layer having a porosity of higher than 5%.
Figure 5B:
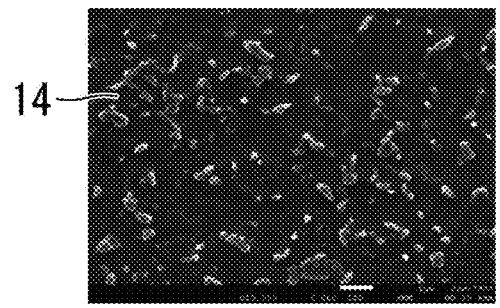
FIG. 5B illustrates the state of an insulating layer having a porosity of 5% or lower.

A sample was polished to ½L to expose a WT cross section. The image of the cross section obtained by SEM was subjected to a binarization process based on tones, and the area of sintered portions of the multilayer body and pores that remained due to insufficient sintering was calculated. Then, the area percentage of the pores relative to the multilayer body was calculated and defined as the porosity. A porosity of 5% or higher and 10% or lower (i.e., from 5% to 10%) was evaluated as good and expressed as G, and a porosity of 5% or lower was evaluated as excellent and expressed as E. FIG. 5A shows the state of an insulating layer having a porosity of higher than 5%. FIG. 5B shows the state of an insulating layer having a porosity of 5% or lower.

The evaluation results of "observation of color of coil electronic component surface", "evaluation of crack formation load", "resolution (aspect ratio)", and "denseness within multilayer body" of each numbered sample are summarized in Table 1.

amount of glass frit is large. Therefore, sintering progresses, and crack extension can be minimized due to a low inorganic filler content. It has been found that sample 9 can provide an coil electronic component that has a high strength needed for the performance thereof.

On the other hand, in each of sample 1 and sample 6, 5 vol % or higher and 24 vol % or lower (i.e., from 5 vol % to 24 vol %) of the first inorganic filler (alumina) having a high refractive index is contained, and the total amount of first inorganic filler (alumina) and second inorganic filler (quartz) is 25 vol % or higher and 40 vol % or lower (i.e., from 25

TABLE 1

| Sample number | Composition of insulating layer (%) | | | Color of coil electronic component surface | Resolution (aspect ratio) | Crack formation load (N) | Denseness within multilayer body |
| --- | --- | --- | --- | --- | --- | --- | --- |
| | Glass (borosilicated glass) | Frist inorganic filler (alumina) | Second inorganic filler (quartz) | | | | |
| 1 | 60 | 5 | 35 | E | 1.7 | 74 | E |
| 2 | 75 | 20 | 5 | E | 1.0 | 100 or higher | E |
| 3 | 72 | 12 | 16 | E | 1.5 | 90 | E |
| 4 | 70 | 14 | 16 | E | 1.2 | 100 or higher | E |
| 5 | 68 | 10 | 22 | E | 1.5 | 89 | E |
| 6 | 70 | 24 | 6 | E | 0.5 | 100 or higher | E |
| 7 | 70 | 1 | 29 | G | 2.0 | 34 | E |
| 8 | 50 | 10 | 40 | E | 1.5 | 33 | G |
| 9 | 85 | 10 | 5 | E | 1.5 | 39 | E |

(7) Evaluation Results

From the results of the observation of the color of the coil electronic component surface in Table 1, it has been found that regarding sample 7, which contains a small amount of first inorganic filler (alumina) having a high refractive index, the coil conductive layers (internal electrode layers) is visible through the surface; however, when the side gap portion has a thickness of 30 μm, the colors are the same with each other, and the light transmittance is suppressed.

On the other hand, sample 1, sample 6, sample 8, and sample 9 contain the first inorganic filler (alumina) having a high refractive index in an amount of 5 vol % or higher and 24 vol % or lower (i.e., from 5 vol % to 24 vol %). Thus, the color of a portion of the coil electronic component surface that is above the coil conductive layers (internal electrode layers) and the color of the side gap portion are the same with each other.

This shows that the light transmittance of the insulating layer after firing can be adjusted by controlling the amount of first and second inorganic fillers.

From the results of evaluation of crack formation load in Table 1, it has been found that sample 7, which contains a small amount of first inorganic filler (alumina) and a large amount of second inorganic filler, can provide a coil electronic component that has a high strength needed for the performance thereof. In sample 8, the total amount of first inorganic filler (alumina) and second inorganic filler (quartz) is excessively large, and thus, the amount of glass frit is small. Therefore, the composition of sample 8 is not appropriate for sintering. However, it has been found that sample 8 can provide a coil electronic component that has a high strength needed for the performance thereof. Furthermore, in sample 9, the total amount of first inorganic filler (alumina) and second inorganic filler (quartz) is small, and thus, the vol % to 40 vol %). Therefore, it has been found that sample 1 and sample 6 can each provide a coil electronic component having a higher strength.

The results of the evaluation of resolution (aspect ratio) in Table 1 shows that in each of sample 1 and sample 9, the amount of the first inorganic filler (alumina) and the second inorganic filler (quartz) is within the appropriate range. Therefore, it has been found that sample 1 and sample 9 can each provide a wiring pattern having an aspect ratio of 0.5 or higher.

Sample 1, sample 5, sample 7, and sample 9 each contain a small amount of first inorganic filler (alumina). Therefore, it has been found that such samples can each provide a wiring pattern having an aspect ratio of 1.0 or higher, which is more preferable.

From the results of the evaluation of denseness within the multilayer bodies in Table 1, it has been found that sample 1 and sample 9 each have excellent denseness.

The embodiments of the present disclosure are disclosed as described above. The present disclosure is not limited to such embodiments.

In other words, the features of the above-described embodiments, such as mechanisms, shapes, materials, numbers, positions, and arrangements, can be variously modified without departing from the technical idea and the object of the present disclosure. Such modifications are included in the present disclosure.

In the embodiments, in the structure of the coil, the coil conductive layers, each of which is wound less than one turn, are stacked on each other; however, the coil conductive layer may be wound one or more turns. In other words, the coil conductive layer may have a planar spiral shape.

The winding axis direction of the coil is substantially the same as the Z-axis direction in the embodiments and may be parallel to the first main surface.

The external electrodes are disposed so as to extend from the respective end surfaces to the main surfaces and the side surfaces in the embodiments and may be disposed differently. The first external electrode may extend from a first end surface to a second main surface and partially cover the first end surface and the second main surface. The second external electrode may extend from a second end surface to a second main surface and partially cover the second end surface and the second main surface.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A photosensitive insulating paste comprising:
   glass frit;
   a first inorganic filler;
   a second inorganic filler;
   an alkali-soluble polymer;
   a photosensitive monomer;
   a photopolymerization initiator; and
   a solvent,
   wherein the first inorganic filler has a refractive index of 1.7 or higher,
   the second inorganic filler has a refractive index of 1.55 or lower, and
   when an amount of the glass frit is denoted as A, an amount of the first inorganic filler is denoted as B, and an amount of the second inorganic filler is denoted as C, the following conditions are satisfied in the photosensitive insulating paste: A+B+C=100, B is from 5 vol % to 20 vol %, and C is from (25-B) vol % to (40-B) vol %.

2. The photosensitive insulating paste according to claim 1, wherein
   the glass frit has a softening point of from 700° C. to 900° C., and the first inorganic filler and the second inorganic filler each have a melting point of 950° C. or higher.

3. The photosensitive insulating paste according to claim 1, wherein
   the first inorganic filler is at least one selected from alumina, titania, zirconia, and ceria.

4. The photosensitive insulating paste according to claim 1, wherein
   the second inorganic filler is at least one selected from quartz and crystallized glass.

5. The photosensitive insulating paste according to claim 2, wherein
   the first inorganic filler is at least one selected from alumina, titania, zirconia, and ceria.

6. The photosensitive insulating paste according to claim 2, wherein
   the second inorganic filler is at least one selected from quartz and crystallized glass.

7. The photosensitive insulating paste according to claim 3, wherein
   the second inorganic filler is at least one selected from quartz and crystallized glass.

8. The photosensitive insulating paste according to claim 5, wherein
   the second inorganic filler is at least one selected from quartz and crystallized glass.

9. An electronic component comprising a multilayer body that includes a plurality of internal electrode layers and an insulating layer between the internal electrode layers in a stacking direction,
   wherein side gap portions are positioned between respective side surfaces of the multilayer body that are parallel to the stacking direction and the plurality of internal electrode layers,
   the side gap portions contain glass, a first inorganic filler, and a second inorganic filler,
   the side gap portions have an average thickness of from 5 μm to 30 μm,
   the first inorganic filler has a refractive index of 1.7 or higher,
   the second inorganic filler has a refractive index of 1.55 or lower, and
   when an amount of the glass is denoted as A, an amount of the first inorganic filler is denoted as B, and an amount of the second inorganic filler is denoted as C in a predetermined cross section of the side gap portion, an area ratio between A and B and C satisfies the following conditions: A+B+C=100, B is from 5 vol % to 20 vol %, and C is from (25-B) vol % to (40-B) vol %.

10. The electronic component according to claim 9, wherein
    the side gap portion has a porosity of 5% or lower.

* * * * *